US009836574B2

(12) United States Patent
Willard et al.

(10) Patent No.: US 9,836,574 B2
(45) Date of Patent: Dec. 5, 2017

(54) VEHICLE MANAGEMENT DEVICES

(75) Inventors: Alexandra Willard, Essex (GB); Glen Alan Tunstall, Essex (GB); Ruth Dixon, Essex (GB); Emmanouil Hatiris, Essex (GB)

(73) Assignee: Tantalum Innovations Limited, Uxbridge, Middlesex (GB)

( * ) Notice: Subject to any disclaimer, the term of this patent is extended or adjusted under 35 U.S.C. 154(b) by 406 days.

(21) Appl. No.: 13/262,203

(22) PCT Filed: Apr. 1, 2010

(86) PCT No.: PCT/GB2010/000664
§ 371 (c)(1),
(2), (4) Date: Apr. 17, 2012

(87) PCT Pub. No.: WO2010/112872
PCT Pub. Date: Oct. 7, 2010

(65) Prior Publication Data
US 2013/0096895 A1    Apr. 18, 2013

(30) Foreign Application Priority Data

Apr. 2, 2009  (GB) .................................. 0905836.3

(51) Int. Cl.
*G06F 17/50* (2006.01)
*B60K 37/02* (2006.01)
(Continued)

(52) U.S. Cl.
CPC .......... *G06F 17/5095* (2013.01); *B60K 37/02* (2013.01); *B60W 50/0098* (2013.01);
(Continued)

(58) Field of Classification Search
CPC ........... G06F 17/00; B60R 16/02; G07C 5/00;
G07C 5/0825; Y02T 10/84
(Continued)

(56) References Cited

U.S. PATENT DOCUMENTS 4,439,158 A * 3/1984 Weber .............................. 434/71
4,494,404 A    1/1985 Strifler
(Continued)

FOREIGN PATENT DOCUMENTS

EP    1386776 A2    2/2004
GB    2410560 A     8/2005
(Continued)

OTHER PUBLICATIONS

I. Arsie et al., "A Computer Code for S.I. Engine Control and Powertrain Simulation," Electronic Engine controls 2000: Modeling, Neural Networks, OBD, and Sensors (SP-1501), SAE Techical Paper Series, SAE 2000 World Congress, Detroit, MI, Mar. 6-9, 2000.*

(Continued)

*Primary Examiner* — Omar Fernandez Rivas
*Assistant Examiner* — Shiuh-Huei Ku
(74) *Attorney, Agent, or Firm* — Crawford Maunu PLLC

(57) ABSTRACT

A vehicle monitoring device (VMO) in accordance with the invention comprises a microprocessor programmed to simulate a vehicle's powertrain, that is arranged to receive signals from a vehicle's engine management system to produce a real-time simulated model of the vehicle's powertrain operation when the vehicle's actual instantaneous fuel consumption and/or emissions can be accurately predicted during operation of the vehicle and compared with predetermined or calculated performance characteristics for the powertrain under the pertaining conditions in order to display the instantaneous operating conditions in relation to the optimum under any driving condition. The VMO is advantageously arranged to receive the signals from the on-board diagnostics (OBO or OBO-II or equivalent) port. The VMO is preferably programmed so that the performance coefficient is used to calculate the instantaneous and/or cumula- (Continued)

tive quantity or percentage of fuel wasted as a result of non-optimum operation of the vehicle. The invention extends to the display.

18 Claims, 9 Drawing Sheets

(51) Int. Cl.
    *B60W 50/00*     (2006.01)
    *B60W 50/08*     (2012.01)
    *G06F 17/00*     (2006.01)
    *G07C 5/00*     (2006.01)
    *G07C 5/08*     (2006.01)
    *B60R 16/02*     (2006.01)

(52) U.S. Cl.
    CPC ... B60W 50/085 (2013.01); *B60K 2350/1064* (2013.01); *B60K 2350/1092* (2013.01); *Y02T 10/84* (2013.01); *Y02T 90/34* (2013.01)

(58) Field of Classification Search
    USPC ........ 703/8; 701/123, 29.1, 30.8, 51, 99, 70; 705/14.67; 340/462
    See application file for complete search history.

(56) References Cited

U.S. PATENT DOCUMENTS

| | | | |
|---|---|---|---|
| 4,523,457 A | 6/1985 | Bayer et al. | |
| 7,206,689 B1 * | 4/2007 | Johnson | B60W 10/06 701/103 |
| 8,140,358 B1 * | 3/2012 | Ling et al. | 705/4 |
| 2002/0077781 A1 * | 6/2002 | Liebl et al. | 702/183 |
| 2004/0034460 A1 | 2/2004 | Folkerts et al. | |
| 2004/0145461 A1 | 7/2004 | Sandberg et al. | |
| 2006/0077998 A1 * | 4/2006 | Fredriksson | 370/466 |
| 2006/0173602 A1 | 8/2006 | Graf et al. | |
| 2007/0276582 A1 * | 11/2007 | Coughlin | 701/123 |
| 2008/0120175 A1 * | 5/2008 | Doering | B60R 16/0236 705/14.67 |
| 2008/0242504 A1 * | 10/2008 | Kraemer et al. | 477/120 |
| 2008/0262712 A1 | 10/2008 | Duty et al. | |
| 2008/0319605 A1 | 12/2008 | Davis | |
| 2009/0043467 A1 * | 2/2009 | Filev | B60W 20/15 701/57 |
| 2009/0326753 A1 * | 12/2009 | Chen | G01C 21/3469 701/31.4 |
| 2010/0102945 A1 * | 4/2010 | Watson | B60K 35/00 340/462 |

FOREIGN PATENT DOCUMENTS

| | | |
|---|---|---|
| GB | 2451732 A | 11/2009 |
| WO | 03041989 A2 | 5/2003 |
| WO | 2008087541 A1 | 7/2008 |

OTHER PUBLICATIONS

A. Rousseau et al., "Integrating Data, Performing Quality Assurance, and Validating the Vehicle Model for the 2004 Prius Using PSAT," SAE International, 2006-01-0667, 2006.*

* cited by examiner

Gear Change Markers (a)

(b)

Gear Change Instructions (c)

VEHICLE MANAGEMENT DEVICES

RELATED PATENT DOCUMENTS

This patent application is the national stage filing under 35 U.S.C. §371 of International Application No. PCT/GB2010/000664 filed on Apr. 1, 2010; which claims foreign priority benefit under 35 U.S.C. §119/365 of United Kingdom Patent Application No. GB 0905836.3 filed on Apr. 2, 2009; each of these patent documents is fully incorporated herein by reference.

This invention relates to vehicle management devices, and in particular to those which are arranged or adapted to produce driver feedback intended to enable or encourage a driver to use less fuel and to drive more efficiently.

Many attempts have been made in the past to extract engine operating data in order to improve driver behaviour and/or compare vehicles in a fleet. Whilst most modern vehicles are provided with such information, it may not be sufficient to allow or encourage the driver to reduce fuel consumption or emissions significantly, or it may not be presented in an easily understandable way. However, on the one hand it is generally difficult to interpret the information in a way that can contribute any significant overall improvement in efficiency, and secondly, the information is either over-simplified, instantaneous or inaccurate and thus not conducive to provoke a change of behaviour in driver performance in terms of an improvement in fuel consumption and/or emissions.

One suggestion is the past has been to display a signal indicating fuel consumption in liters/100 km or the saving in liters/100 km saved by a gear change (U.S. Pat. No. 4,494,404 Daimler-Benz AG), but such detailed information may be distracting or lag the event that has caused it. Another solution suggests using small LEDs on a tachometer that light up to show the rpm where optimum omissions are achieved (US2004/0145461 Sandberg et al.). WO2008/087541 (Toyota) targets the speed at which the accelerator is operated. All these methods and devices are intended to be fitted as OEM equipment having access to proprietary engine information and generally requiring additional non-standard sensors to be fitted to the powertrain. And the displays are confusing, and at worst may be distracting and possibly dangerous.

The present invention seeks to overcome these difficulties using a device that can be connected to any recent vehicle (having A vehicle monitoring device (VMD) in accordance with the invention comprises a microprocessor programmed to simulate a vehicle's powertrain, that is arranged to receive signals from a vehicle's engine management system in order to produce a real-time simulated model of the vehicle's powertrain operation whence the vehicle's actual instantaneous fuel consumption and/or emissions can be accurately predicted during operation of the vehicle and compared with predetermined or calculated optimum performance characteristics for the powertrain under the pertaining conditions in order to display the instantaneous operating conditions in relation to the optimum under any driving condition.

The display is such that the driver will understand with minimal training or explanation what action needs to be taken to reduce fuel consumption or emissions if he is driving outside the optimum engine operating parameters for those driving conditions.

The VMD may also be programmed to calculate a performance coefficient relating actual performance to the optimum, which may be used to compare driver or vehicle performance by a third party or by subsequently downloading the information.

The VMD may be provided in the form of a plug-in device that is arranged to receive the signals from the on-board diagnostics (OBD, OBD-II, CAN or equivalent, herein referred to as the 'OBD port' or the 'diagnostics port') port. The device is preferably self-calibrating, using signals from the diagnostics port, and if necessary by decoding and scaling some non-standard signals to obtain sufficient information to construct an accurate model of the vehicle engine and powertrain. As a precaution and in order to ensure reliable and constant operation of the device an array is populated with operating data on the engine so that if some of the signals are not available or are delayed the operating model of the device is programmed to retrieve the necessary values from the array using available data values and interpolating. Such signals will include among others, the mass airflow, engine speed and the road speed of the vehicle or permit the engine simulation to be constructed and to operate.

Some non-standard signals from the OBD port may be difficult to decode, or to scale. They are detected, identified and scaled in accordance with our earlier patent application no. PCT/GB2008/001870. The VMD may be calibrated as described in our earlier patent application no. PCT/GB2008/000806.

The device is programmed to simulate the engine operation in response to signals which are available from the OBD port. Once the OBD signals have been identified, and the VMD has been calibrated (in accordance with our previous patent applications) the VMD can simulate the engine operation in real time and can resort where necessary to data stored on a data array created during the calibration process. The VMD may advantageously continue to recalibrate itself or to update values in the data array in order to maintain accuracy of the VMD engine simulation even as the powertrain suffers from wear or ceases to operate at its optimum efficiency. Indeed, such changes may indicate to an operator when a vehicle is in need of maintenance.

Once calibrated the data array holds information that can be accessed to calculate the optimum engine performance under any driving and load conditions. These data may be used to calculate the optimum efficiency reference point against which actual driver performance is measured. In other circumstances, for example a manufacturer may use design data to provide the optimum efficiency reference.

An important aspect of the invention resides in the way in which the information is presented to the driver. Two parameters need to be communicated to the driver in order to achieve optimum emissions or fuel consumption. These are the optimum engine speed range, generally which gear should be engaged, and the accelerator operation in terms of the throttle opening and its speed of operation. The optimum engine speed is conveniently displayed by a bar in a neutral or green colour covering the optimum range, or by pointers showing the upper and lower limits. Outside this range a bar can be coloured, say, red to indicate that the driver is no longer in the optimum speed range, or similarly by changing the colour of the pointers to red, and in extreme circumstances, even to increase the width or brightness of the bar or the pointers. Leaving the optimum range preferably is also accompanied by an audible warning, either a sound or even a simulated voice instruction.

The VMD may be programmed so that the said performance coefficient is used to calculate the instantaneous and/or cumulative quantity or percentage of fuel wasted as a result of non-optimum operation of the vehicle.

The relationship between the engine speed and the road speed may be used to deduce which gear should be engaged, and the VMD is programmed to compare the fuel efficiency for the powertrain with the engaged gear with that which could be obtained in an alternative gear. Such information may be presented to the driver to show him when to change gear in order to obtain better efficiently under the prevailing load and driving conditions.

The gear-change information is conveniently displayed on the vehicle's a engine speed display showing at which revs the driver should change up in gear or change down. The information may conveniently be displayed as markers outside or above the analogue tachometer scale.

An additional indicator to change gear may be provided as a separate icon, which is arranged to indicate to the driver when to change gear up or down. The icon may appear larger, brighter, more prominent, to flash or become increasingly animated as the need to change gear becomes more urgent as fuel is increasingly wasted. An audible warning or instruction may also be included if desired.

In one display that has been tested, the engine speed indicator or tachometer is displayed as a circular analogue scale on an LCD panel where the colour of the pointer changes from green to red as it leaves the optimum engine speed band for the gear engaged at the time. Another display technique comprises an arcuate band adjacent to the tachometer scale, indicating the optimum rpm under the prevailing load conditions an in a neutral or green colour. If the engine speed leaves the optimum engine speed range the band shifts with the pointer and changes colour, for example to red.

Another feature of the invention is that the VMD is programmed to calculate a vehicle acceleration indicator using the increase or decrease of the vehicle's speed. However, this would display a high value at low speeds and a low value at higher speeds, and would thus not represent the throttle opening. Thus, in a preferred embodiment, the acceleration indicator is arranged instead to represent the energy input to the engine (SE).

The acceleration indicator is displayed as an analogue display which, like the tachometer is arranged to change colour when the vehicle is operated outside a predetermined optimum or acceptable acceleration range. This may be supplemented by adding a symbol to the instrument display, which is arranged to appear when a predetermined rate of acceleration has been exceeded to indicate to the driver to reduce the throttle opening.

The VMD can also be programmed to drive a fuel display indicating fuel wasted. This may comprise a bar showing total fuel used and the proportion of fuel wasted, or a single bar, preferably with a percentage figure displayed above or beside it, showing the fuel wasted. In order to incentivise the driver further to drive economically, the fuel display may comprise more than one bar of a bar chart. Where two bars are shown, the preferred choice, a first bar shows the driver's current trip performance, and a second bar shows the driver's best previous performance in order to motivate him to improve on it.

The VMD may also be arranged to store statistics relating to driver or vehicle behaviour, including fuel used, fuel wasted, harsh braking or acceleration or other statistics relating to poor driver or vehicle performance or excessive emissions. This information may be downloaded either on demand or automatically for control or comparison.

The invention will now be further described by way of example with reference to the accompanying diagrams in which FIG. 1 is a diagram showing a VMD with a customised LCD display;

FIGS. 2 (a) to (i) show engine speed indicators with gear-change symbols;

FIG. 4 shows icons displayed as engine speed increases (left to right);

Figure 1:
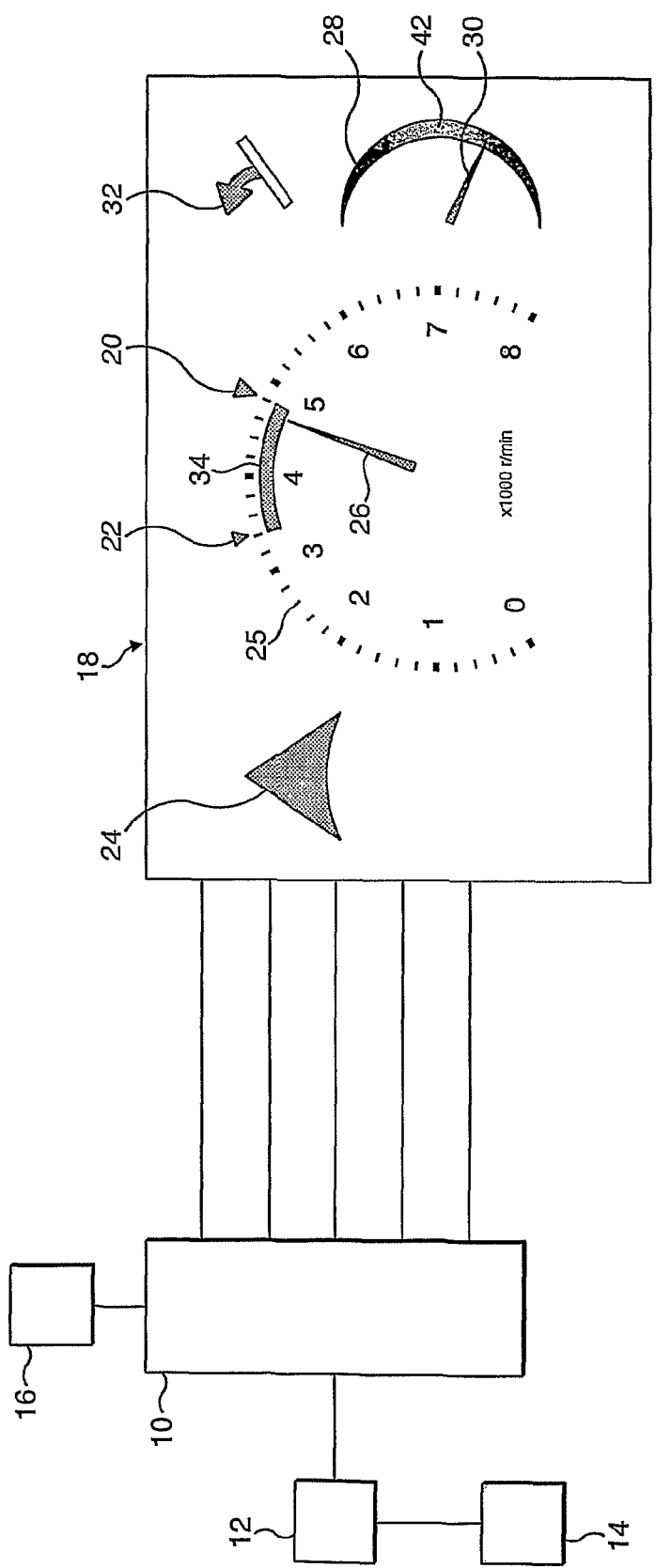
FIG. 1 shows a vehicle monitoring device (VMD) 10 which is arranged to receive signals from a vehicle's engine management system 12 via a direct connection to the OBD port 14. These signals should include the instantaneous mass air-flow, engine speed and the road speed of the vehicle or permit such values to be calculated.

In practice, the signals from the OBD port 14 are often difficult to decode, or to scale. They are thus detected, identified and scaled in accordance with our earlier patent application no. PCT/GB2008/001870. In addition, the VMD 10 needs to be calibrated and an example of a method for calibrating it is described in our earlier patent application no. PCT/GB2008/000806. The calibration data is stored in a data array 16. Data from the array is used to calculate the optimum (or minimum) fuel consumption (the reference fuel consumption) for the pertaining speed and load conditions.

The VMD is programmed to produce a simulated model of the vehicle's powertrain operation whence the vehicle's actual instantaneous fuel consumption can be accurately predicted during operation of the vehicle. This is compared with reference value which is calculated by the VMD or elsewhere based on predetermined or calculated optimum performance characteristics for the powertrain under the pertaining conditions. The actual fuel consumption is compared with the reference or optimum value to calculate a performance coefficient which relates actual performance to the optimum.

Once the OBD signals have been identified, and VMD has been calibrated, the device is ready to simulate the engine operation in response to signals which are generally available from the OBD port. When such signals are not available or are incomplete, data is retrieved by the VMD from the array of stored values 16 which has been built up during the calibration process, and may be updated periodically as the powertrain performance varies over time.

The VMD is preferably programmed so that the said performance coefficient is used to calculate the instantaneous and/or cumulative quantity or percentage of fuel wasted as a result of non-optimum driving of the vehicle. The total cumulative fuel used during a trip may be represented as a bar, of which the fuel wasted can be shown as a proportion of the bar height. Alternatively, the fuel wasted may be shown as a simple bar whose height represents the proportion of fuel wasted. The percentage may be displayed above or along side it. In order to incentivise the driver further to drive economically, the fuel display may comprise more than one bar of a bar chart. Thus, a first bar shows the driver's current trip performance, and a second bar shows the driver's best previous performance in order to motivate him to improve on it.

The relationship between the engine speed and the road speed is also used to calculate which gear is engaged, and the VMD is programmed to compare the fuel efficiency of the engaged gear with that which could be obtained in an alternative gear. Such information is presented to the driver to show him when to change gear in order to obtain the best fuel efficiently under the prevailing speed and load conditions.

Fuel efficiency depends on many different criteria, but from a driver's point of view, it will depend on maintaining the engine speed at an optimum and controlling the accelerator as appropriate. Attempts have been made to indicate to the driver the engine speed range at which the engine should be operated irrespective of the gear engaged. By contrast, the present invention, using the powertrain simulation by the VMD to predict the actual instantaneous fuel consumption, and comparing this with a reference, optimum value, allows much more precise data to be provide to the driver. And the data will generally depend on the load, driving conditions, and the gear engaged at the time, so that the traditional blanket instruction, for example, to change down at 2000 rpm, may not be ideal or optimum under all, or indeed, any conditions.

The gear-change information is conveniently displayed for the driver on an engine speed indicator showing at which revs the driver should change up (CU) in gear or change down (CD). The information is displayed as arrow-shaped markers 20, 22 outside or above the analogue tachometer scale 25—as CU upper limit 20 and CD lower limit 22.

An additional icon 24 to change gear shown as a separate icon, which is arranged incite the driver to change gear up or down. The icon 24 may appear larger, brighter, more prominent, to flash or become increasingly animated as the need to change gear becomes more urgent as fuel is increasingly wasted. An audible warning or instruction may also be included if desired.

In one display that has been tested, the tachometer is displayed as a circular analogue scale 25 on an LCD panel where the colour of the pointer 26 changes from green to red as it leaves the optimum revs for the gear engaged at the time.

Another feature of the invention is that the VMD is programmed to replicate the vehicle acceleration by reference to the power demand on the engine (ΔEnergy). This is displayed as an analogue display 28 with a pointer 30 which, like the tachometer is arranged to change colour from a green or neutral colour to a warning red when the vehicle is operated outside a predetermined optimum or acceptable acceleration range. A reduce accelerator icon 32 shows up on the instrument display when a predetermined rate of acceleration has been exceeded to indicate to the driver to reduce the rate of acceleration.

Another aspect of the invention relates to the means for displaying the information to the driver of a vehicle. This is now described.

The objective was to design the look and feel of a real-time in-car driving efficiency monitoring system, with a focus on keeping the selected gear acceptable for the current road speed, engine speed acceptable for the current gear, and keeping acceleration as economical as possible.

The concept centres on ways to condition efficient driving behaviour in users of the system: There is an emphasis on pre-attentive forms of perception (no direct gaze normally necessary). Familiar instruments aid understanding of display and instructions and positive and negative feedback are used to condition driver behaviour, and to pre-empt instructions, rather than waiting until they are given. Good design aids acceptance by being pleasant to use.

The design is based on a 640×400 pixel LCD display area. Background is black for daytime contrast, and night-time subtlety. The primary instrument is a tachometer, which is provided to aid decisions about gear changes (and serves the same purpose here). The familiar layout aids comprehension.

The tachometer's scale marks are coloured according to the ideal engine speed range for the current gear, however the colour scheme changes depending on driver performance. The optimum range 34 may also be bounded by the CU and CD gear-change markers 20,22. The object of this interface is to help the drive to keep the needle within the optimum range 34 between the two markers. If the needle 26 exceeds the CU marker 20, the needle 26 turns red, the CU marker 20 turns red and the arcuate band moves to below the needle as 36 and it too turns red. The same occurs if the needle drops below the CD marker 26 or the lower end of the arcuate band 34; the needle turns red, as does the CD marker and the band, now in position 38, turns red. In either case an audible warning is sounded.

If the needle moves far outside of the markers, a gradual progression of increasingly intrusive gear-change icons 24 appear, and persist until the engine speed is rectified. The needle is coloured to match its position on the dial.

The secondary instrument is the 'accelerometer' 28. The goal is to keep acceleration needle 30 within the wide, green band 42. If the acceleration moves too far beyond this band, the 'ease off' indicator 32 appears.

In universal design considerations, the 80/20 rule asserts that approximately 80 percent of the effects generated by any complex system are caused by 20 percent of the variables in that system. This is true of the complex modelling of a car's fuel usage which, from the point of view of the driver's choices, equates to acceleration and gear change.

Elements that move together in a common direction are perceived as a single group. Related elements should move at the same time, velocity and direction. This is exploited by making instructions share the same logic as readings, making it likely that the instructions will be followed by the user as the readings change.

Elements that are arranged in alignment, close to each other, or in a straight line or smooth curve are perceived as a group, and are interpreted as being more related than elements unaligned, more distant, or not on the line or curve.

One technique is to teach a desired behaviour by reinforcing increasingly accurate approximations of the behaviour. This is particularly suited to teaching complex behaviour by breaking it down into simple behaviours, and introducing one simple behaviour at a time.

The display is for use in a vehicle whilst driving, so must not distract the driver's attention from the driving task. This has several implications:

The amount of information that can be conveyed is small;
The information should not counteract or conflict with information that the driver is receiving elsewhere.

The design is focused on preattentive forms of visualisation. Using preattentive forms of visualisation makes it more likely that users can detect and track targets. Display forms which can be perceived without direct gaze are preferred, and forms which can be perceived at a glance are acceptable. A partial list follows: flashing, sudden appearance/disappearance of a distinct element, sound, distinct colours, subtle variation of colour and stereoscopic depth.

However, although presence-absence and flashing are most perceptible, they are so demanding of attention as to distract from the driving task. On the other hand, the human perceptual system easily becomes blind to change if attention is drawn elsewhere while the change takes place, so these more demanding techniques can be brought into play if the human doesn't appear to have noticed another change after some time.

The display should accommodate to ambient conditions. For example, it should not be too bright at night or too dim in sunlight. Conceivably, in icy or foggy conditions, greater emphasis might be put on safety than driving efficiency. The data display should focus on real-time results. Past performance would only be relevant as a benchmark; archival data may be available offline.

As shown, as well as providing a valuable aid to operational efficiency, the device/display is designed to be attractive to look at; and a joy to use, with attention paid to aesthetics, and to building a symbiotic relationship between vehicle and driver.

The background of the display is preferably black, so as to be readable during the day, and not too bright at night. This makes the display generally easier and faster to read. However this may not always match other instruments on the vehicle, and the display can simply be modified to match the other instrumentation whilst maintaining the simple clear design.

The interface should not be intrusive with efficient driving. This means that the interface elements in motion should be 'eased' into position and appearance at a suitable frequency above 24 Hz. However, when the driving is inefficient, some subtle 'degradation' may be introduced into the smoothness of the interface. For instance, rather than settling comfortably into place, interface elements should perhaps act a little more springily, moving quicker, and slightly overshooting their targets. Doing this can help to condition the driver to avoid erratic driving.

'Change up'/'change down' voice instructions may be used as a last resort, when it is clear that the driver is not responding to the visual display. In general, if people are cognitively loaded in one sense of perception, the most effective way to raise awareness of new information is through a different, ideally unused, sense of perception, which is the rationale behind the voice instructions. However, the auditory sense is also likely to be occupied with conversations, GPS instructions, the radio, etc., and that is why sound should be used sparingly.

A 28-pixel diameter black disc is drawn on at the centre of the dial, to obscure the end of the needle. The tachometer is augmented to show the acceptable engine speed range for the current gear. This is done in two ways:

By colouring the dial to show the acceptable range, and
By positioning the ideal gear change points as markers on the dial.

Whilst driving efficiently, the display uses muted/neutral colours to show the acceptable range for the current gear. The needle of the dial is coloured to match its position on the dial. However, whilst driving inefficiently, the display changes to more vivid colours. The green is progressively dulled so that the overall colour of the display becomes red.

Figure 3:
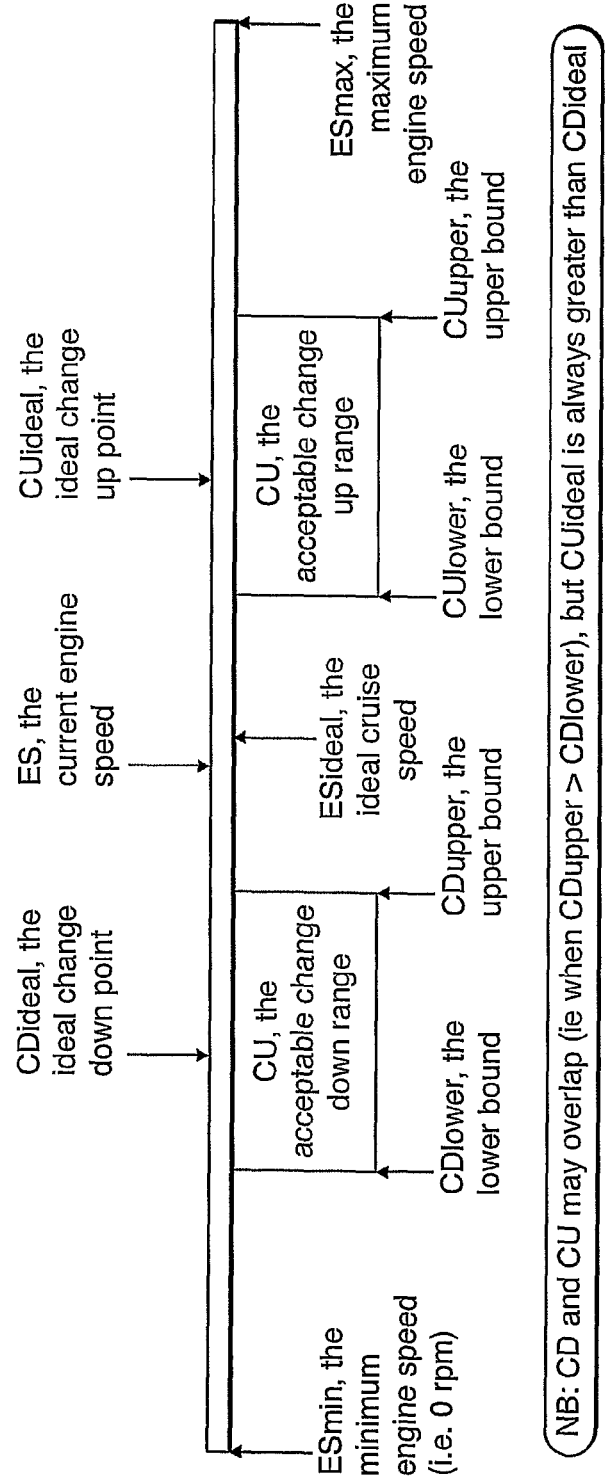
FIG. 3 is a diagram of a logic band for the gear-change display.
Figure 4:
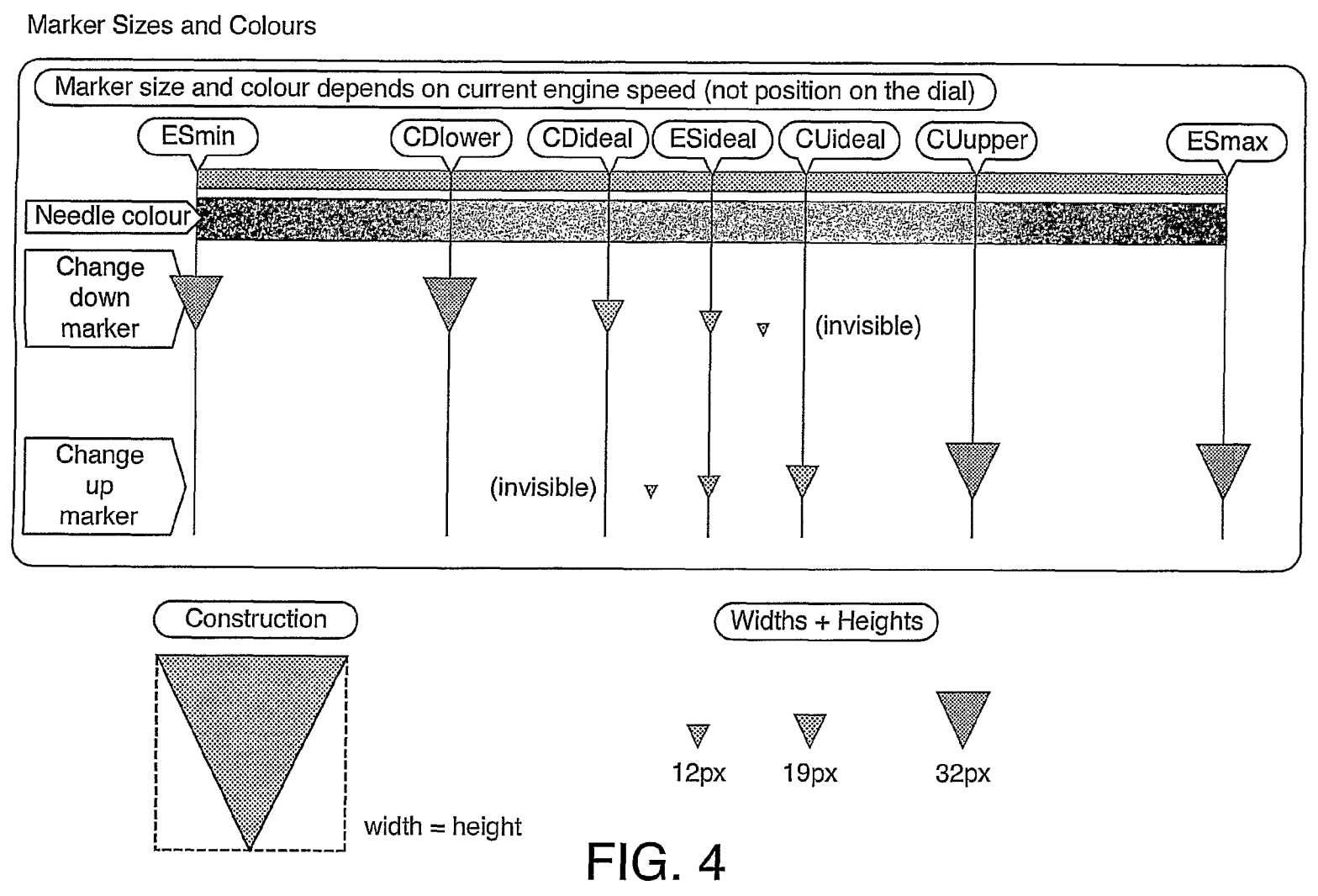
Figure 5:
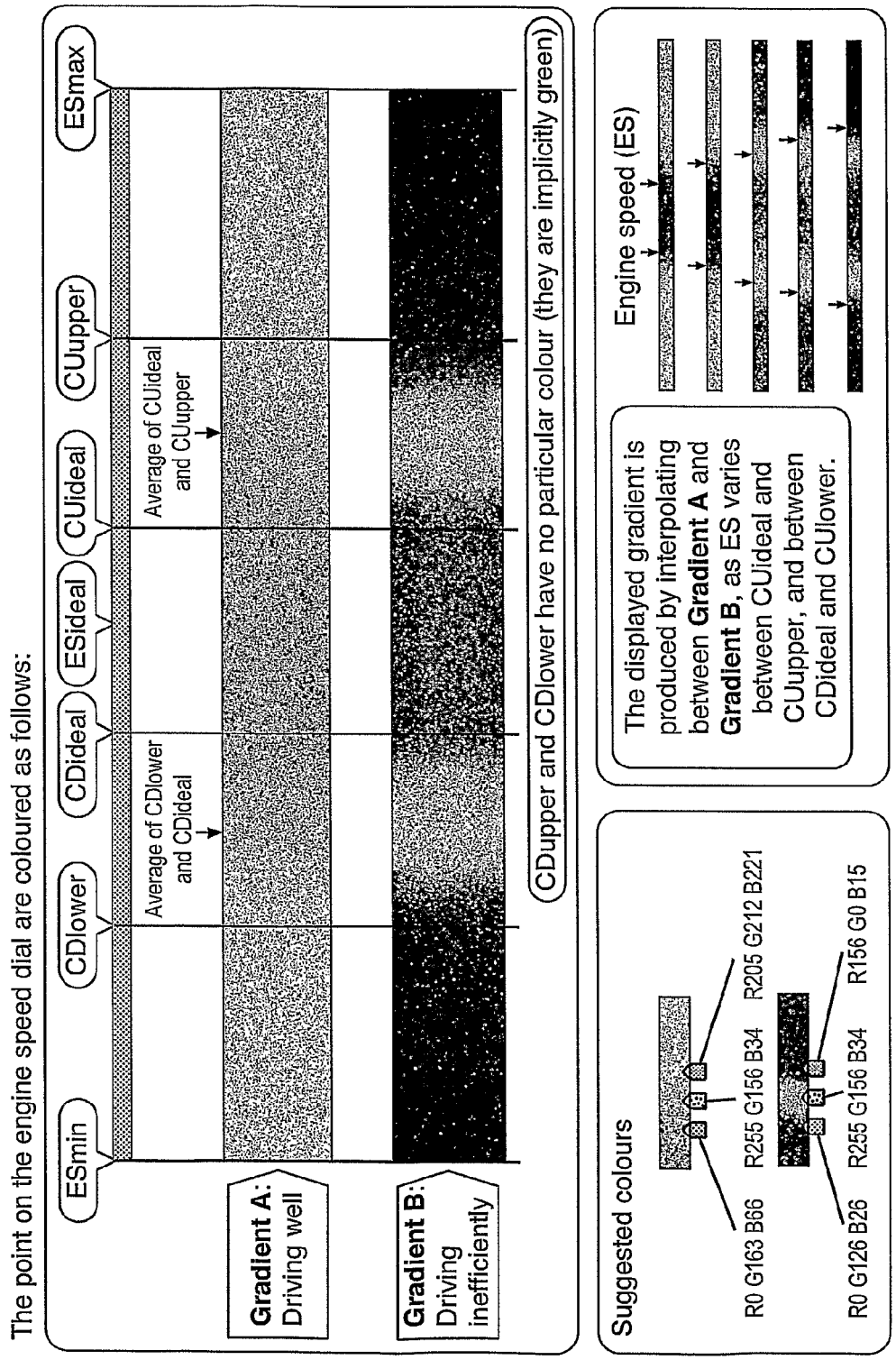
FIG. 5 shows the colour pallet used to represent good and bad behaviour as engine speed increases (left to right)

The points on the engine speed dial are coloured as shown in FIGS. 3, 4 and 5.

During efficient operation, the pointer and operating band are green and muted green. As the tachometer needle approaches the moment to change gear the appropriate symbol remains green, but increases in size. Outside the preferred operating range, the pointer becomes red, and the band on the dial becomes deeper and deeper red. The appropriate gear change symbol turns to red and increases in size. In extreme driving behaviour, additional symbols appear, for example, large upwardly or downwardly facing arrows, which begin to flash or move as the behaviour persists. A red lift-foot (off the accelerator) symbol appears.

The engine speed numbers (in ×1000 rpm) do not particularly help to promote an intuitive understanding of efficient driving, but are useful to aid cognitive recognition/ replacement of the instrument as an engine speed display. Each number is the colour of its corresponding tick mark.

Figure 2:
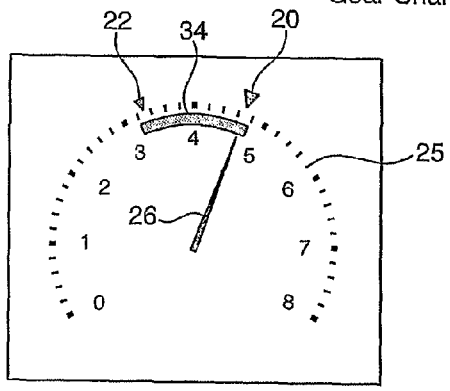
Figure 2:
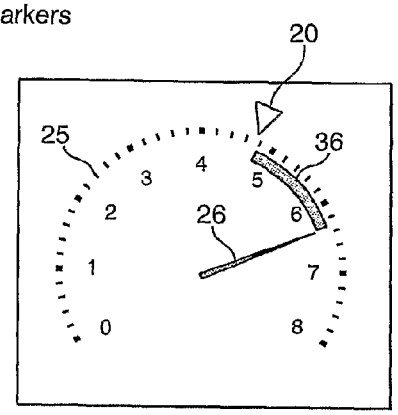
Figure 2:
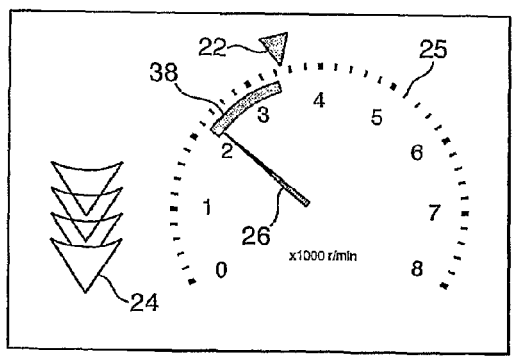
Figure 2:
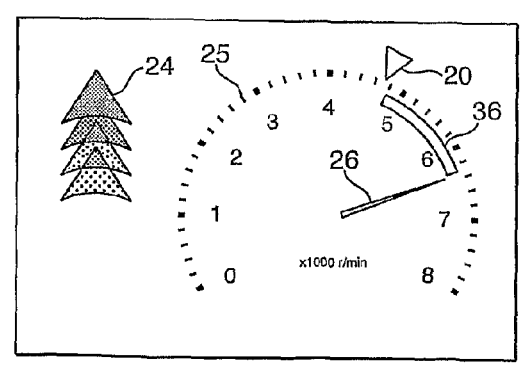
Figure 2:
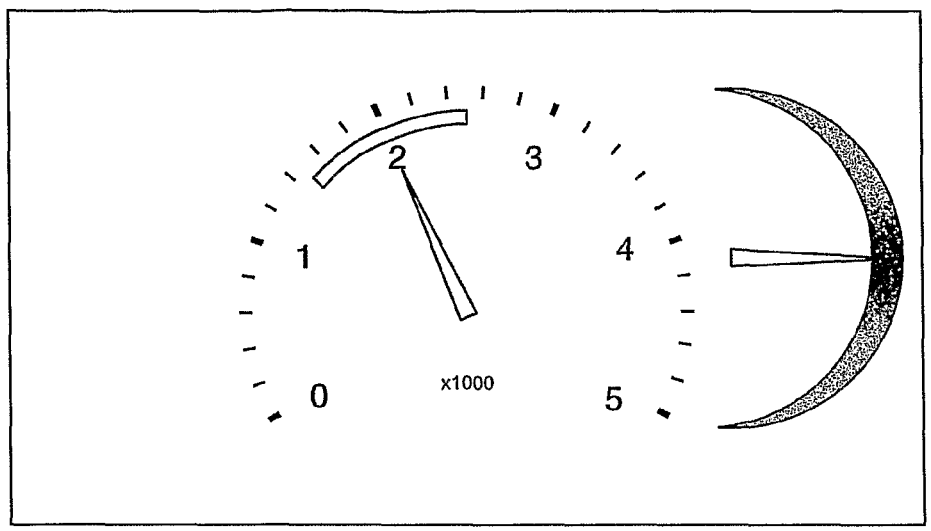
Figure 2:
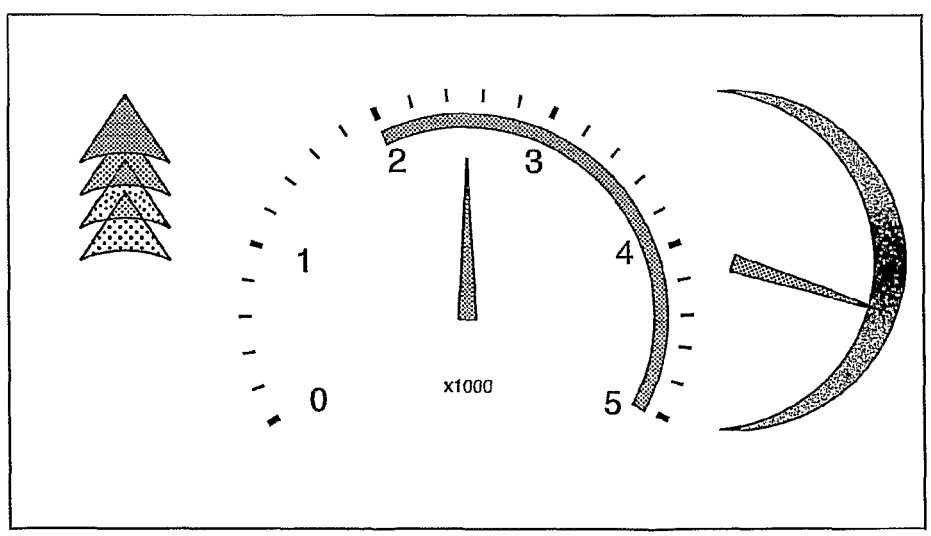
Figure 2:
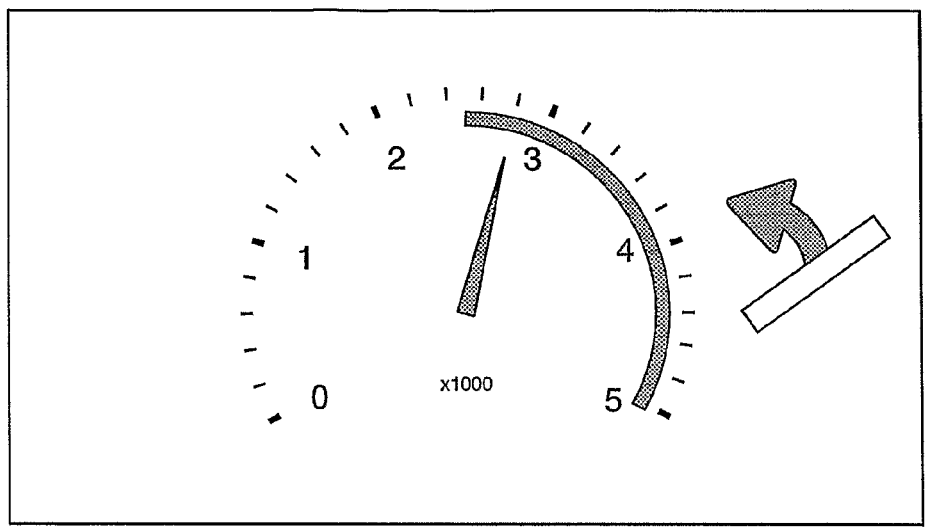
Figure 2:
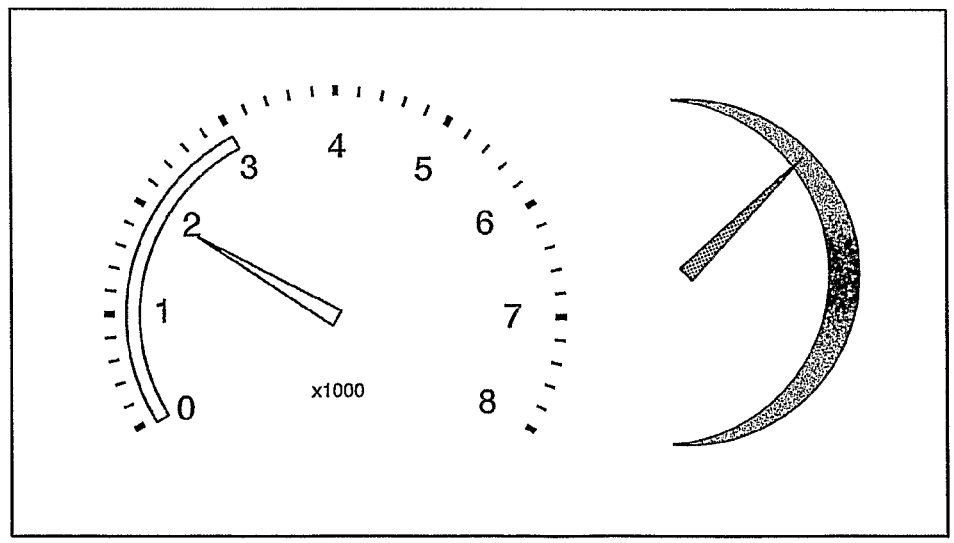
Figure 2:
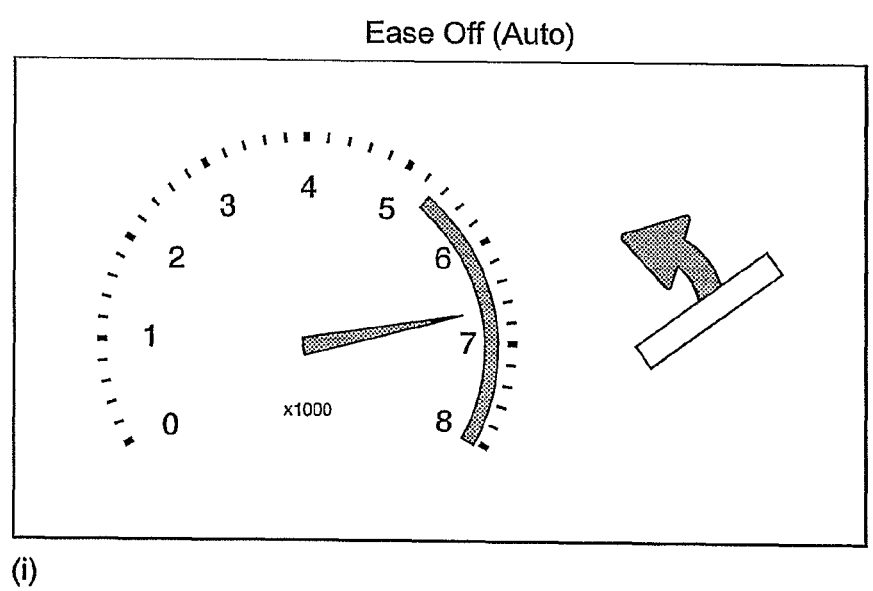

To issue a visual 'change gear' instruction, the display shows a red arrow 24 FIG. 2(*d*) pointing up or down 24 FIG. 2(*c*). The arrows appear when the needle moves significantly past the CD or CU markers 22,20 on the dial. In other words, the CD or CU arrows 24 appear only when the driver has badly missed an optimum gear change.

The arrow is coloured red to show a relationship to the indicator on the dial. It fades in from transparent when it appears, and also moves into position at the top or bottom of the screen. The movement animation is so that the driver knows whether the arrow is pointing upwards or downwards without direct attention to the display. The animation takes 450 ms. Once it has fully appeared, the gear change arrow should flash at the same time as the dial indicator. The gear change arrow remains visible until the engine speed is rectified.

Presentation and behaviour of the 'accelerometer' display is a slightly delicate task because the objective is to display an indication of the throttle position or energy demand.

Figure 6:
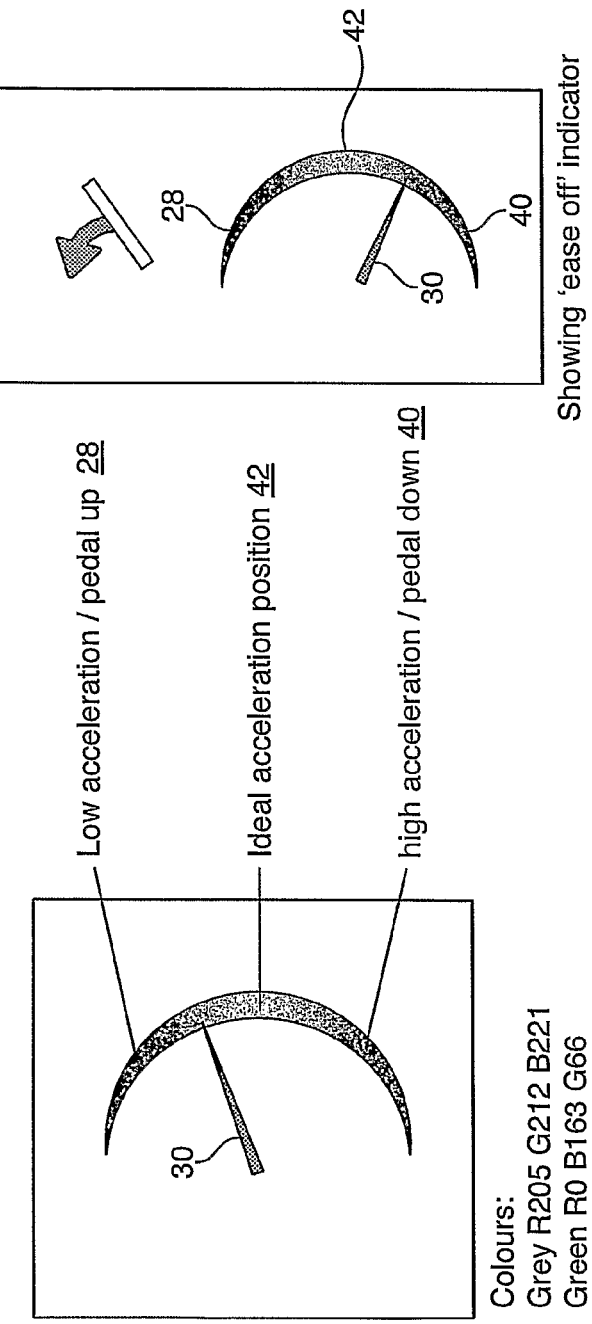
FIG. 6 shows the 'accelerator' gauge and icon.

The accelerometer is thus a modified display of $\Delta KE$, although its meaning is unlikely to be apparent to most drivers. It is tempting to have a bar-graph show acceleration, with the height of the graph indicating the amount of acceleration, but such a bar graph would show an inverse relationship to the physical accelerator pedal position, and no physical relationship at all to actual acceleration. In order to train driver behaviour, we need a display where up=low acceleration, and down=high acceleration. A right-oriented dial has this behaviour:

In FIGS. 1 and 6 the central green arcuate area 42 of the dial indicates the optimum acceleration band. If the acceleration exceeds the optimum value by some set tolerance, then the 'ease off' icon 32 is displayed. However, range/ boundaries are not displayed on the accelerometer to avoid making the cognitive task too difficult and distracting for the driver.

One option is to provide a bar on the display recording 'total fuel used' and showing the proportion of fuel wasted by comparing in real time the driver performance under the prevailing conditions with what fuel would have been used if the vehicle had been driven optimally. A second bar could be displayed showing the driver's best previous performance. Other variations are possible by showing or indicating, graphically or otherwise, for example, cost per ton moved, etc. Introducing the interface progressively like this allows the potential to introduce more advanced features than are currently included.

There are many possibilities for displaying driving efficiency data.

Wasted fuel, or fuel efficiency;
Cost of fuel used/wasted;
Emissions ($CO_2$, etc.)

In a vehicle with automatic transmission, the vehicle monitoring device may be used to assist with acceleration and monitor or control the automatic gear shifts. The device may also assist a driver by predicting the engine speed at which the automatic transmission will change gears.

The simulation provided by the VMD produces and can store and process a great deal of operating data which may be transmitted directly to the vehicle operator in real time or in batches. Whilst driving the vehicle much of this data would be confusing or distracting. Thus, in order to maximise the advantage of the VMD—if something is not crucial to show whilst driving, it can be logged and shown later when there are far fewer limitations to the interface.

The invention claimed is:

1. A vehicle monitoring device comprising:
   a microprocessor programmed to simulate a vehicle's powertrain and arranged to:
   receive diagnostic-based OBD (on-board diagnostic) signals having an OBD protocol, which are different than signals obtained directly from an engine management system of the vehicle and communicated without the OBD protocol, via a diagnostics port of the vehicle,
   use the received OBD signals to produce a real-time simulated model of the vehicle's powertrain operation by decoding and scaling the performance indicator signals from the diagnostics port, and using the decoded and scaled performance indicator signals to produce the real-time simulated model,
   use the simulated model to predict the vehicle's actual instantaneous operating conditions including fuel consumption and/or emissions during operation of the vehicle by a driver of the vehicle,
   compare the predicted fuel consumption and/or emissions with predetermined optimum performance characteristics for the powertrain under load conditions in order to display the instantaneous operating conditions in relation to the optimum under any driving condition; and
   a display including an engine speed indicator that is configured and arranged to display information indicative of the instantaneous operating conditions and actual instantaneous engine speed together with indications as to at which engine speed the driver of the vehicle should change up in gear or change down in gear under prevailing load conditions, wherein
   the vehicle monitoring device is configured and arranged to calculate an acceleration indicator from an energy demand ($\Delta E$) of the vehicle, using the instantaneous operating conditions in order to produce an indication of the vehicle's acceleration or throttle position that is based on the OBD signals, and
   the display is configured and arranged to indicate the energy demand ($\Delta E$) on the engine and a symbol when a predetermined energy demand ($\Delta E$) has been exceeded to instruct the driver to reduce the throttle opening.

2. A vehicle monitoring device as claimed in claim 1 in which:
   the device is arranged to receive the signals from an on-board diagnostics (OBD) port of the vehicle, and such signals include the mass air-flow, engine speed and the road speed of the vehicle or signals that permit such values to be calculated, and
   the microprocessor is configured and arranged to predict the vehicle's actual instantaneous operating conditions by:
   simulating the operation of the vehicle based on the signals from the OBD port, and
   determining a value of an operating parameter that is not provided via the OBD port based on the simulated operation.

3. A vehicle monitoring device as claimed in claim 1 in which a relation between the engine speed and road speed of the vehicle is used to calculate the gear engaged, and the vehicle monitoring device is programmed to compare fuel efficiency of the vehicle at the engaged gear with that which could be obtained in other gears in order to produce an indication to the driver as to when to change gear in order to operate the powertrain more efficiently under the prevailing load conditions.

4. A vehicle monitoring device as claimed in claim 1 in which the display is an analogue display and change-up and change-down indicators are displayed as markers outside or above the analogue display, or alternatively an optimum range is displayed as an arcuate band extending over an acceptable range.

5. A vehicle monitoring device as claimed in claim 4 in which an additional indicator to change gear is provided on a display, which is arranged to indicate to the driver when to change gear up or down.

6. A vehicle monitoring device as claimed in claim 4 in which at least one of the indicators grows in size or intensity as the engine speed approaches a change-gear point.

7. A vehicle monitoring device as claimed in claim 4 in which the display is arranged to change displayed indicators to a warning color when the engine is being operated outside a pre-determined acceptable engine speed range and/or an audible warning signal is sounded.

8. A vehicle monitoring device as claimed in claim 1 in which the display is an analogue display which is arranged to change color when the vehicle is operated outside a predetermined operating range.

9. A vehicle monitoring device as claimed in claim 1 which is provided with or is arranged to drive a fuel display indicating fuel wasted.

10. A vehicle monitoring device as claimed in claim 9 in which the fuel display comprises a bar showing total fuel used and a proportion of fuel wasted.

11. A vehicle monitoring device as claimed in claim 9 in which the fuel display is arranged to comprise two bars, a first bar to show a best previous performance for the driver, and a second bar to show a current trip performance for the driver.

12. A vehicle monitoring device as claimed in claim 2 in which a performance coefficient relating actual performance to the optimum is used to calculate an instantaneous and/or cumulative quantity or percentage of fuel wasted as a result of non-optimum driving by an operator.

13. A vehicle monitoring device as claimed in claim 2 in which the relation between the engine speed and the road speed is used to calculate the gear engaged, and the vehicle monitoring device is programmed to compare fuel efficiency of an engaged gear with that which could be obtained in other gears in order to produce an indication to the driver as to when to change gear in order to operate the powertrain more efficiently under the prevailing load conditions.

14. A vehicle monitoring device as claimed in claim 2 having a display including an engine speed indicator which is arranged to display actual instantaneous engine speed together with indications as to at which engine speed the driver should change up in gear or change down under the prevailing load conditions.

15. A vehicle monitoring device as claimed in claim 10 in which the fuel display is arranged to comprise two bars, a first bar to show a best previous performance for the driver, and a second bar to show a current trip performance for the driver.

16. The device of claim 1, wherein the microprocessor is configured and arranged to produce the real-time simulated model by processing the decoded and scaled performance indicator signals with predefined information stored in an array to generate the real-time simulated model via interpolation, and to use the generated real-time simulated model to predict operational characteristics of the vehicle that are not directly provided via the diagnostics port.

17. The device of claim 1, wherein the microprocessor is configured and arranged to, in response to conditions of the vehicle changing over time due to wear, produce a second real-time simulated model of the vehicle's powertrain operation based on diagnostic-based performance indicator signals obtained via the diagnostics port, and use the second simulated model to predict the vehicle's actual instantaneous operating conditions.

18. The device of claim 1, wherein the microprocessor is configured and arranged to use the received performance indicator signals to produce the real-time simulated model of the vehicle's powertrain operation, and during said operation, use the simulated model to predict the vehicle's actual instantaneous operating conditions including fuel consumption and/or emissions.

* * * * *